(12) United States Patent
Yu

(10) Patent No.: US 6,679,727 B1
(45) Date of Patent: Jan. 20, 2004

(54) ELECTRICAL CONNECTOR HAVING IMPROVED BOARD LOCK

(75) Inventor: Hung-Chi Yu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/313,074

(22) Filed: Dec. 6, 2002

(30) Foreign Application Priority Data

Nov. 15, 2002 (TW) .......................................... 91218348

(51) Int. Cl.⁷ .............................................. H01R 13/60
(52) U.S. Cl. ...................................... 439/567; 439/571
(58) Field of Search ................................. 439/567, 571, 439/607, 570, 572

(56) References Cited

U.S. PATENT DOCUMENTS

| | | | | |
|---|---|---|---|---|
| 5,171,165 A | * | 12/1992 | Hwang | 439/567 |
| 5,551,891 A | * | 9/1996 | Huss, Jr. | 439/567 |
| 5,613,877 A | * | 3/1997 | Patel et al. | 439/567 |
| 5,797,769 A | | 8/1998 | Yang et al. | |
| 6,022,243 A | * | 2/2000 | Yang et al. | 439/567 |
| 6,196,870 B1 | * | 3/2001 | Wu | 439/567 |
| 6,203,367 B1 | * | 3/2001 | Wu | 439/567 |
| 6,280,248 B1 | * | 8/2001 | Mitra | 439/571 |
| 6,468,109 B1 | * | 10/2002 | Wu | 439/567 |

* cited by examiner

Primary Examiner—Tho Dac Ta
Assistant Examiner—James R. Harvey
(74) Attorney, Agent, or Firm—Wei Te Chung

(57) ABSTRACT

An electrical connector (1) includes an insulative housing (2), a number of terminals (5) received in the housing, a shell (22) partially enclosing the housing, a pair of board locks (3) and a pair of fasteners (4) securing the board locks onto the housing. Each board lock includes a fixed section (30) fixed to the connector and a pair of spaced legs (311) connected to the fixed section by means of a resilient section (31). The legs have convex portions (320, 330) arranged on opposite outer edges thereof for engaging with inner walls of a hole (60) of a PCB (6) into which the legs are inserted and retention portions (321, 331) arranged on opposite inner edges thereof for abutting against a bottom face (61) of the PCB, thereby securely and stably retaining the connector on the PCB.

1 Claim, 4 Drawing Sheets

ELECTRICAL CONNECTOR HAVING IMPROVED BOARD LOCK

BACKGROUND OF THE INVENTION

1. Field of the Invention

The present invention relates to an electrical connector, and particularly to an electrical connector having board locks for securing the connector onto a printed circuit board.

2. Description of Prior Art

Referring to U.S. Pat. No. 5,797,769 issued on Aug. 25, 1998 to Yang et al., a conventional electrical connector comprises an insulative housing with a plurality of contacts received therein and a pair of board locks retained in the housing. Each board lock comprises a fixed portion for being fixed onto the housing, an intermediate portion perpendicularly extending from the fixed portion, and a tail portion perpendicularly extending from the intermediate portion. The tail portion consists of a pair of legs for being inserted into corresponding through holes of a printed circuit board (PCB) to secure the connector onto the PCB.

However, the board locks only provide the connector with a retention force in a left-to-right direction. Therefore, the connector is unstably retained in the PCB in a front-to-back direction before the contacts are subjected to a soldering process. This will cause the instability during the soldering process of the contacts and increase the difficulty of soldering. As a result, the electrical connection between the connector and the PCB may be unreliable and the quality of signal transmission therebetween may be adversely affected. Hence, an electrical connector with improved board locks is required to overcome the disadvantages of the related art.

SUMMARY OF THE INVENTION

Accordingly, the object of the present invention is to provide an electrical connector with board locks which can make the electrical connector stably mounted on a printed circuit board, thereby ensuring a reliable electrical connection between the electrical connector and the printed circuit board.

In order to achieve the above-mentioned object, an electrical connector in accordance with the present invention comprises an insulative housing, a plurality of terminals received in the housing, a shell partially enclosing the housing, a pair of board locks and a pair of fasteners assembling the board locks onto the housing. Each board lock comprises a fixed section fixed to the connector and a pair of spaced legs connected to the fixed section by means of a resilient section. The legs are formed with convex portions arranged on opposite outer edges thereof for engaging with inner walls of a hole of a PCB into which the legs are inserted and retention portions arranged on opposite inner edges thereof for abutting against a bottom face of the PCB, thereby securely and stably retaining the connector on the PCB.

Other objects, advantages and novel features of the invention will become more apparent from the following detailed description when taken in conjunction with the accompanying drawings.

DETAILED DESCRIPTION OF THE INVENTION

Figure 1:
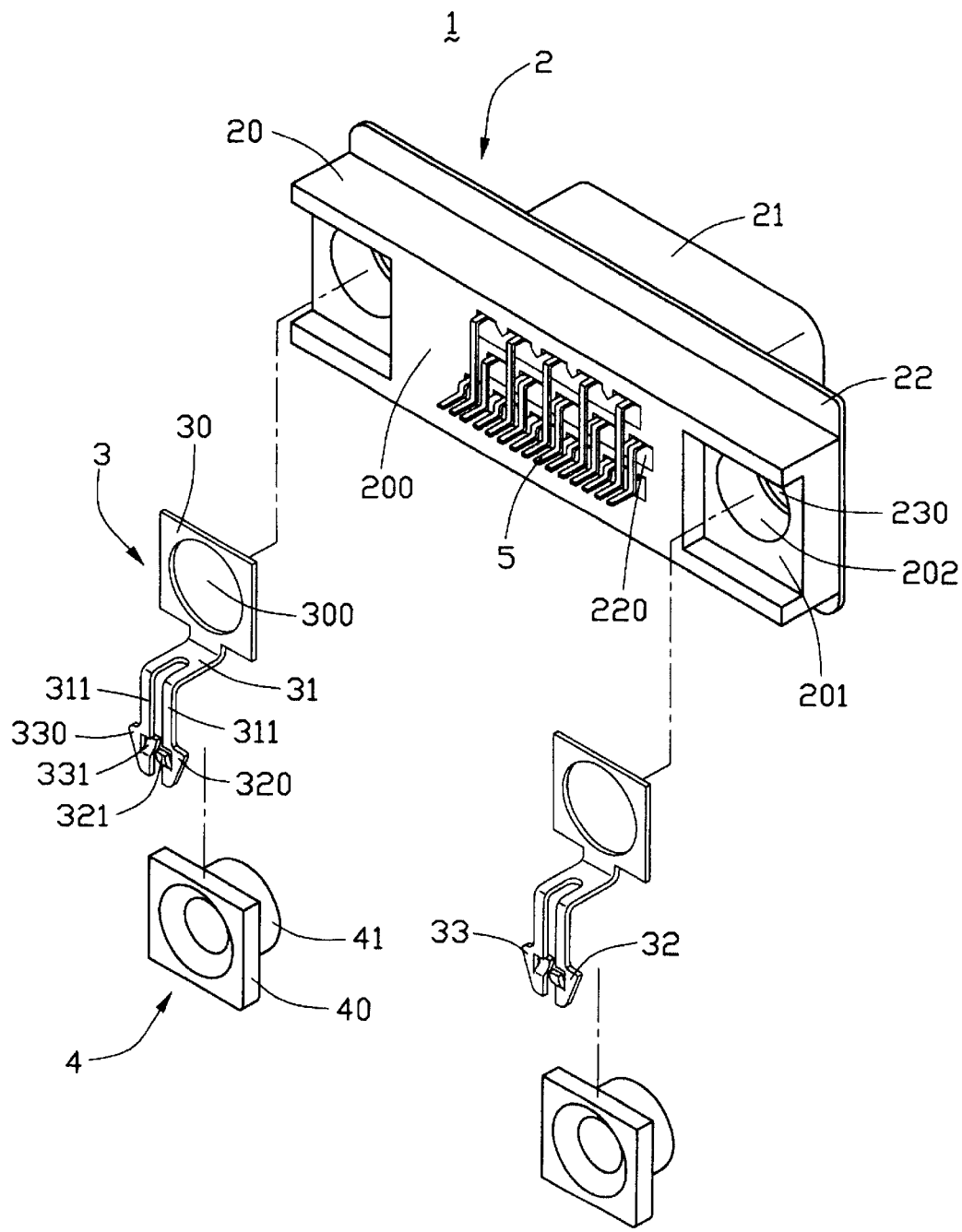
FIG. 1 is a partially exploded perspective view of an electrical connector in accordance with the present invention.
Figure 2:
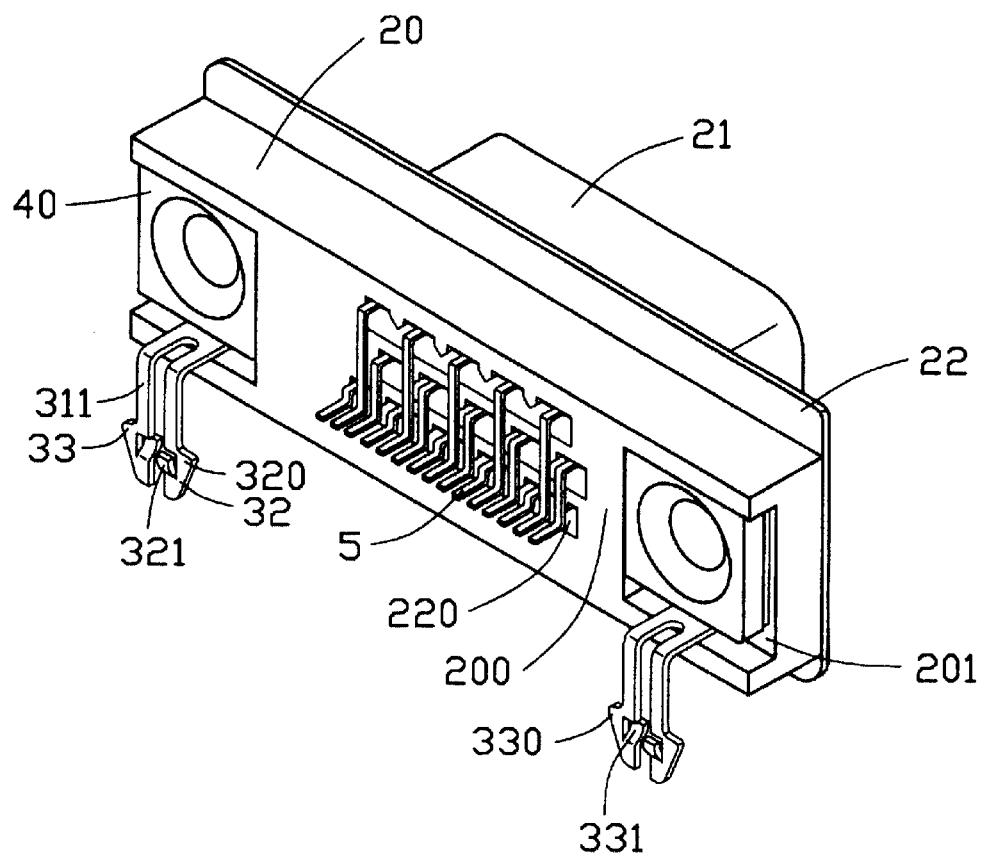
FIG. 2 is an assembled perspective view of the connector of FIG. 1.

Referring to FIG. 1, an electrical connector 1 in accordance with the present invention includes an insulative housing 2, a plurality of terminals 5 received in the housing 2, a shell 22 partially enclosing the housing 2, a pair of boards locks 3 and a pair of fasteners 4 for assembling the board locks 3 onto the housing 2. The housing 2 has an elongate base 20 and a mating portion 21 extending forwardly from a front end of the base 20. The base 20 has an engaging face 200 at a rear end thereof. The housing 2 has a plurality of passageways 220 extending from the mating portion 21 to the engaging face 200 for receiving the terminals 5 extending therethrough. The housing 2 defines a pair of recesses 201 recessed from the engaging face 200 and a pair of apertures 202 extending therethrough and communicating with the recesses 201. The shell 22 encloses the periphery of the mating portion 21 and covers the front end of the base 20 for providing shielding performance to the electrical connector 1. The shell 22 has a pair of circular openings 230 corresponding to the apertures 202.

Figure 3:
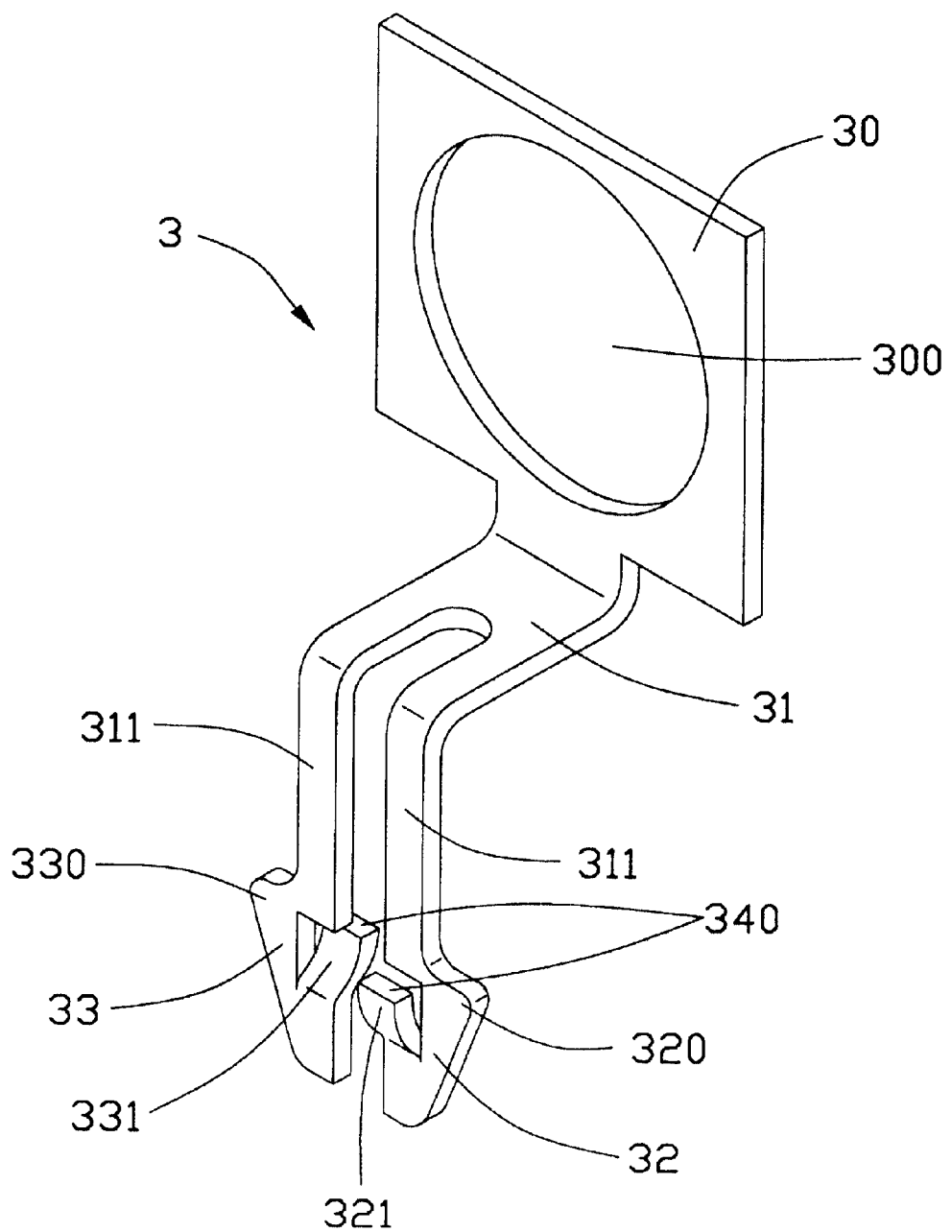
FIG. 3 is an enlarged view of a board lock of the connector.
Figure 4:
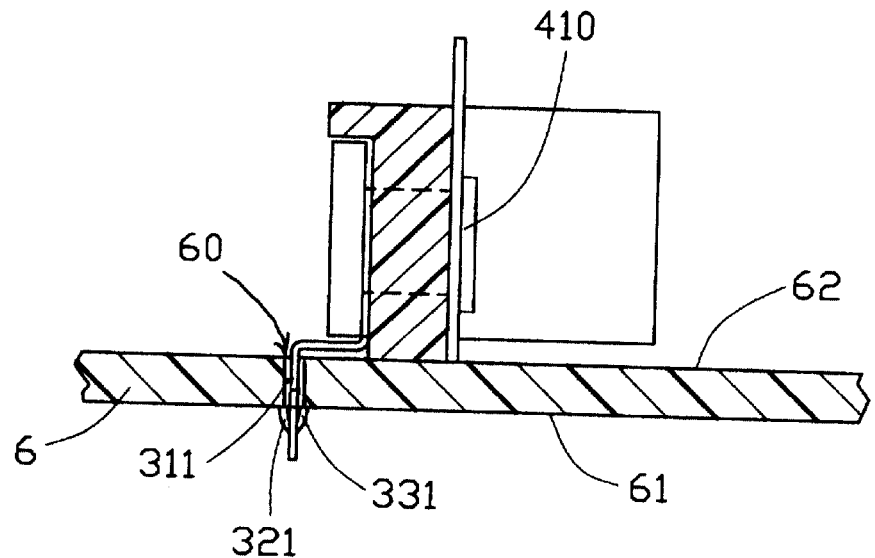
FIG. 4 is a cross-sectional view of the connector in a lateral direction, showing the board lock being mounted onto a printed circuit board.
Figure 5:
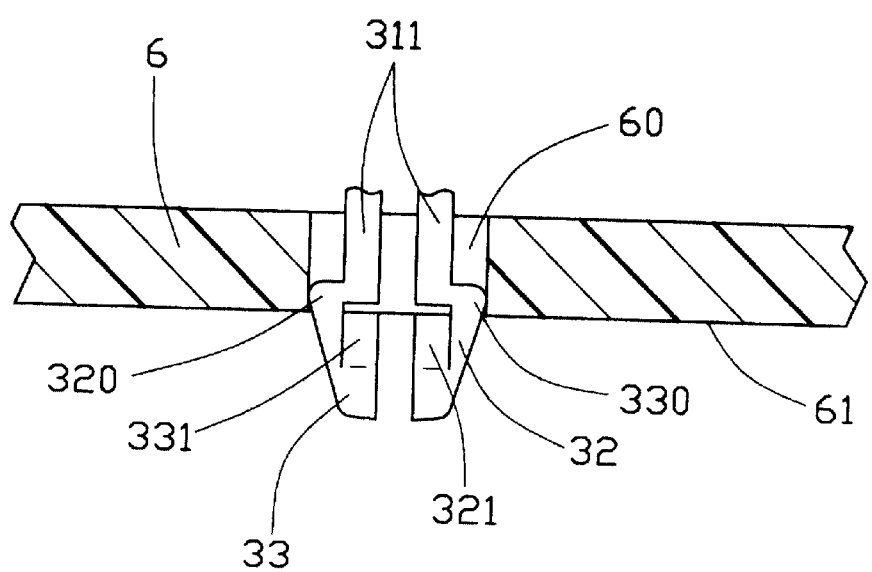
FIG. 5 is a partially enlarged cross-sectional view of the connector in a longitudinal direction, showing the board lock being mounted onto the printed circuit board.

Referring to FIG. 3, each board lock 3 is stamped from a metal sheet and comprises a flat fixed section 30 defining a bore 300 therein. An intermediate section 31 extends from a lower end of the fixed section 30 and a pair of spaced similar legs 311 downwardly extending from the intermediate section 31. In this embodiment, the legs 311 extend integrally from the intermediate section 31, and some changes, if desired, may be made to the structure so that the legs extend directly from the lower end of the fixed section 30. The intermediate section 31 provides resiliency between the legs 311 and the fixed section 30. The legs 311 have a pair of convex portions 320, 330 at free ends 32, 33 thereof, and a pair of retention portions 321, 331 splitted integrally from opposite inner edges of the legs 311. The convex portions 320, 330 project sidewardly from opposite lower outer edges of the legs 311 for providing a retention force in a left-to-right direction, and the retention portions 321, 331 are oppositely arranged in a front-to-back direction for providing a retention force in the front-to-back direction. Each retention portion 321, 331 has a face 340 on the top thereof. In this embodiment, the retention portions 321, 331 are tabs extending integrally from the legs, and some changes, if desired, may be made to the structure. For example, a dimple on each leg can be formed to achieve the same function as the tabs.

As shown in FIG. 1, the fastener 4 has a base plate 40 and a hollow cylinder 41 extending from the base plate 40. The hollow cylinder 41 has a free end 410.

Referring to FIGS. 1–5, in use, the connector 1 is positioned on a top face 62 of the PCB 6 with the legs 311 of the board locks 3 extending through the corresponding holes 60 which are preferably capsulate. The hole 60 has a diameter substantially corresponding to the distance between outer edges of the legs 311. The convex portions 320, 330 of the legs 311 interferentially engage with inner walls of the hole 60 of the PCB 6, and the retention portions 321, 331 of the legs 311 are deformedly inserted through the corresponding hole 60 in the printed circuit board 6. When the retention portions 321, 331 of the legs 311 resume original state after insertion through the hole 60, the faces 340 of the legs 311 abut against a bottom face 61 of the PCB 6. The intermediate section 31 formed between the legs 311 and the fixed section 30, may provide resiliency thereof to facilitate assembling between the legs 311 and the corresponding hole 60 in the PCB 6.

Each fastener 4 extends through the corresponding bore 300 of the board lock 3 and through the corresponding aperture 202 of the shell 22 of the connector 1. The base plate 40 of the fastener 4 is received in the corresponding recess 201. The free end 410 of the hollow cylinder 41 is riveted to abut against a front surface of the shell 22.

The board lock 3 is secured onto the printed circuit board 6 by engagement of the convex portions 320, 330 of the legs 331 with inner walls of the hole 60 and the face 340 of the retention portions 321, 331 with the bottom face 61 of the printed circuit board 6. As a result, the connector 1 can be stably retained on the printed circuit board 6 in both the left-to-right direction and the front-to-back direction.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A board lock adapted to mount an electrical connector onto a printed circuit board comprising:

a fixed section for being attached to the connector; and a pair of legs extending from the fixed section and distanced from each other, each leg comprising a convex portion projecting outwardly in a first direction and a retention portion projecting outwardly in a second direction, the legs being adapted for insertion into a hole defined in the printed circuit board to retain the connector thereon by engagement of the convex portions of the legs with the hole and the retention portions of the legs with a bottom face of the printed circuit board;

wherein either the convex portions or the retention portion of the legs are arranged in opposite directions for providing a retention force for the board lock;

wherein a distance between outer edges of the legs substantially corresponds to a diameter of the hole of the printed circuit board;

wherein the fixed section comprises a bore defined therein, the bore being adapted for receiving a fastener to secure the board lock onto the connector;

wherein a resilient section is formed between the fixed section and the legs;

wherein the retention portions are tabs split from opposite inner edges of the legs;

wherein each tab has a face on the top thereof, the face abutting against a bottom face of the printed circuit board when the connector being mounted onto a top face of the printed circuit board.

* * * * *